(12) United States Patent
Zurek et al.

(10) Patent No.: US 6,782,745 B1
(45) Date of Patent: Aug. 31, 2004

(54) SLOSH SUPRESSOR AND HEAT SINK

(75) Inventors: Lawrence A. Zurek, Warren, MI (US); Eric C. Myers, Howell, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 23 days.

(21) Appl. No.: 10/371,535

(22) Filed: Feb. 21, 2003

(51) Int. Cl.[7] .................................................. G01F 1/68
(52) U.S. Cl. ................................ 73/204.22; 73/204.12
(58) Field of Search ......................... 73/204.12, 204.22

(56) References Cited

U.S. PATENT DOCUMENTS

| 3,701,540 A | 10/1972 | Pringle ........................ 280/5 A |
| 4,603,733 A | 8/1986 | Loevinger ...................... 165/41 |
| 4,844,278 A | 7/1989 | Freiwald et al. ............ 220/1 V |
| 5,311,930 A | 5/1994 | Bruenn ........................ 165/102 |
| 5,423,376 A | 6/1995 | Julien et al. ............... 165/80.4 |
| 5,629,538 A | * 5/1997 | Lipphardt et al. ............ 73/726 |
| 5,749,242 A | 5/1998 | Mowery ....................... 62/347 |
| 5,767,447 A | * 6/1998 | Dudderar et al. .......... 174/52.4 |
| 5,960,980 A | 10/1999 | Burke et al. ................. 220/325 |
| 6,070,462 A | * 6/2000 | Igarashi et al. ........... 73/204.22 |
| 6,176,131 B1 | 1/2001 | Hecht et al. ............. 73/204.26 |
| 6,182,639 B1 | 2/2001 | Igarashi et al. ............. 123/494 |

* cited by examiner

*Primary Examiner*—Harshad Patel
(74) *Attorney, Agent, or Firm*—Brinks Hofer Gilson & Lione

(57) ABSTRACT

A slosh suppressor prevents damage to electronic components and wire bonds of a circuit module contained in a circuit chamber formed by the housing of a sensor module. The circuit module is positioned within the circuit chamber and has a silicon gel layer positioned thereon for protecting the circuit module from the environment. A housing cover is structured to engage the sensor housing and close the circuit chamber. The housing cover has a projection extending into the circuit chamber and engaging the silicon gel layer to reduce vibration in the silicon gel layer and protect the circuit module.

23 Claims, 6 Drawing Sheets

SLOSH SUPRESSOR AND HEAT SINK

FIELD OF THE INVENTION

The present invention relates generally to electronic devices having a circuit module which is covered by a layer of silicon gel for environmental protection, and more particularly relates to a mass flow air sensor utilized to measure the air intake of an automobile engine and the protection of the sensor's circuit module.

BACKGROUND OF THE INVENTION

The prior art teaches the importance of measuring air intake into an internal combustion engine for purposes of improving engine control. One type of mass flow air sensor includes a housing that projects into the main air intake tube of the engine for sampling the intake air and generating a signal representative of the instantaneous mass fluid flow through the passage. The housing defines a circuit chamber having a circuit module positioned therein. The circuit module includes various electronic components and wire bonds linked to those components for generating the air flow signal that is sent to the electronic engine control system. Typically, the circuit module is covered by a silicon gel layer to protect the circuit module from the environment. Finally, the circuit chamber is closed by a housing cover.

It has been found that the silicon gel layer in the circuit chamber shows large motions or vibrations which are induced by vehicle vibration. Unfortunately, these large vibrations or motions in the silicon gel can cause premature fracturing of the circuit components or wire bonds. Accordingly, there exists a need to provide a sensor having an electronic component that is well protected from the environment, provides good heat transfer, and which can withstand the vibrations on the sensor from the automobile environment.

BRIEF SUMMARY OF THE INVENTION

The present invention provides a slosh suppressor for preventing damage to electronic components and the wire bonds contained inside the housing of an electronic device such as a sensor, and most preferably a mass air flow sensor. Generally, the slosh suppressor is formed into a sensor module comprising a sensor housing defining a circuit chamber. A circuit module is positioned within the circuit chamber and has a silicon gel layer positioned thereon for protecting the circuit module from the environment. A housing cover is structured to engage the sensor housing and close the circuit chamber. The housing cover has a projection extending into the circuit chamber and engaging the silicon gel layer to reduce vibrational displacement of the silicon gel layer and protect the circuit module.

The projection extends into the silicon gel layer, and preferably extends only partially into the silicon gel layer. The projection divides the silicon gel layer into multiple sections and inhibits the transfer of vibrational energy between sections of the silicon gel layer. The separation of the silicon gel layer into separate mass sections increases a resonant frequency in each section and reduces the movement of the silicon gel layer when the sensor module is subject to vibration.

Preferably, the housing cover includes a plurality of projections extending into the circuit chamber and engaging the silicon gel layer to reduce vibrational displacement. Preferably the plurality of projections do not intersect or otherwise are arranged to prevent trapped air within the circuit chamber between the silicon gel layer and the housing cover. Most preferably, the projections are positioned adjacent the wire bonds and the electronic components to provide small mass sections of silicon gel layer proximate the wire bonds. The smaller the mass section, the higher the resonant frequency giving smaller motions in the mass section. Finally, the housing cover may include a plurality of fins on its outer surface which promote heat transfer from the circuit module through the cover.

BRIEF DESCRIPTION OF THE DRAWINGS

The accompanying drawings incorporated in and forming a part of the specification illustrate several aspects of the present invention, and together with the description serve to explain the principles of the invention. In the drawings.

DETAILED DESCRIPTION OF THE INVENTION

Figure 1:
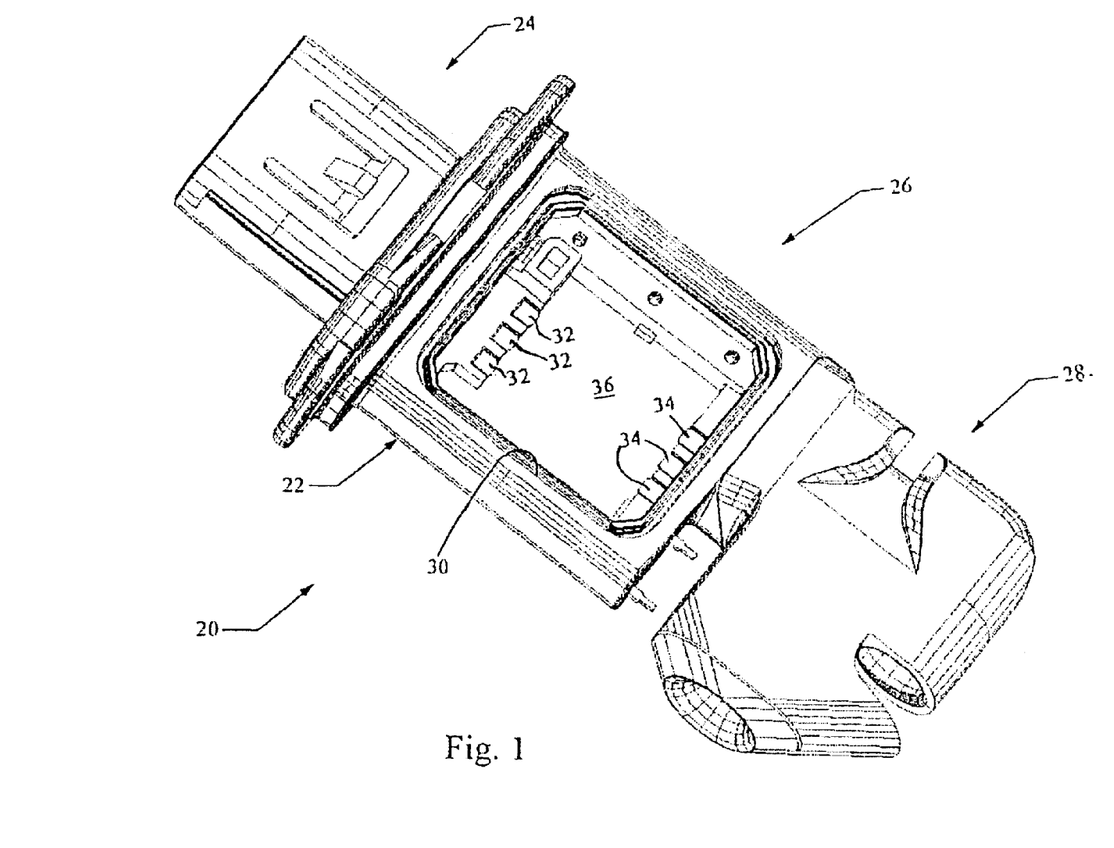
FIG. 1 is a perspective view of a sensor module constructed in accordance with the teachings of the present invention.

Turning now to the figures, FIG. 1 depicts a perspective view of a sensor module 20 which employs the slosh suppressor of the present invention. The sensor module 20 has been depicted as a mass air flow sensor for use with the air intake passageway of an automobile engine, although it will be recognized that other electronic devices may employ the present invention, such as a pressure module, an engine control module, a brake module, or any device having a circuit module covered with a gel layer. The sensor module 20 shown in FIG. 1 generally comprises a connector portion 24, a circuit portion 26, and a fluid sampling portion 28. The connector portion 24 and fluid sampling portion 28 will not be described in detail herein, but their details can be found in co-pending application Ser. Nos. 10,126,810 and 10,267,281 which are hereby incorporated by reference in their entirety.

The sensor module 20 generally includes a sensor housing 22 which defines the three portions 24, 26, 28 of the module. The sensor housing 22 generally defines a circuit chamber 30 formed within the circuit portion 26 of the housing 22. The circuit chamber 30 includes an electronics cover 36 which is attached to the housing 22, typically by an adhesive. The electronics cover 36 is preferably made of a metal material to provide a heat sink for a circuit module 40 (FIG. 2) that is attached to the electronics cover 36. Typically, the circuit module 40 is adhesively attached directly to the electronics cover 36, which is then positioned on the sensor housing 22 and adhesively attached thereto.

Figure 2:
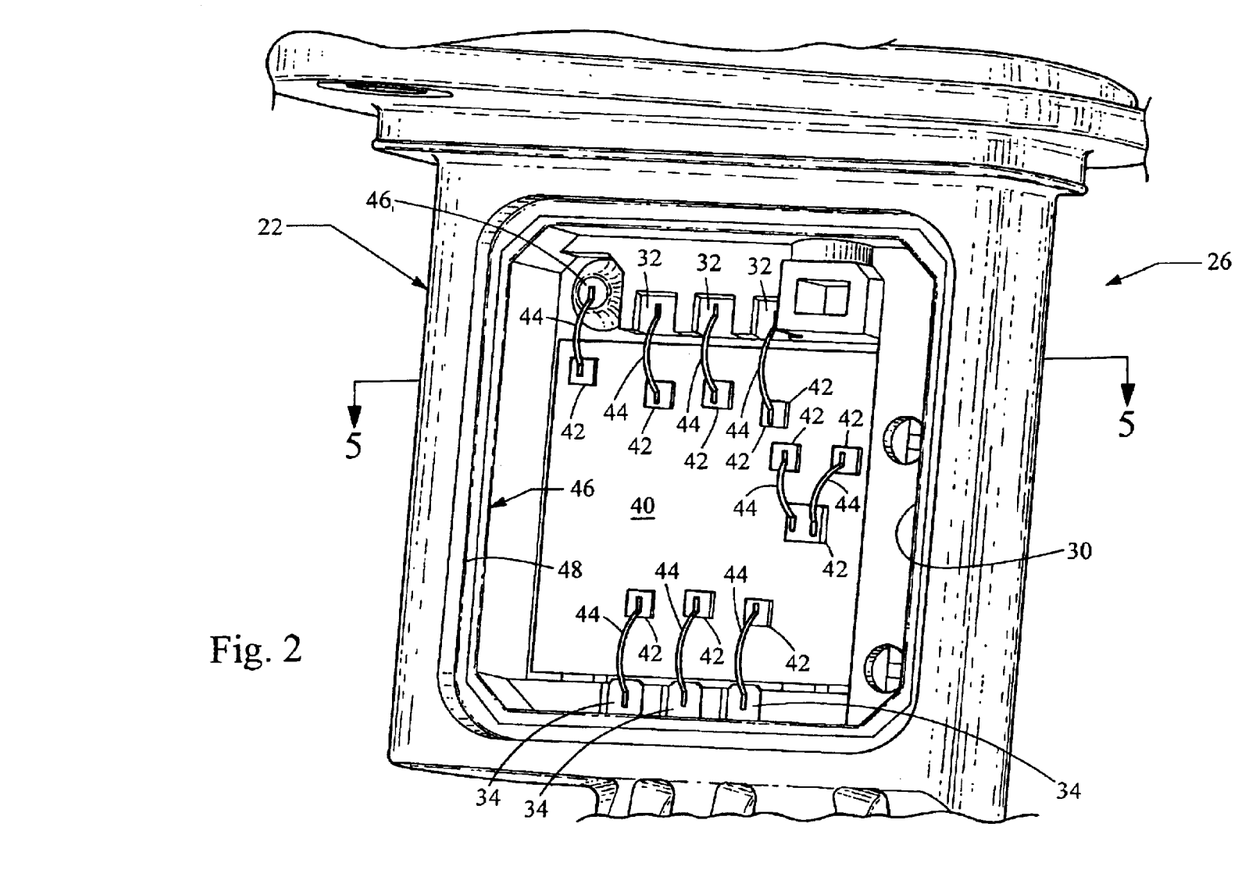
FIG. 2 is an enlarged, partially cut-away, view of the sensor module shown in FIG. 1 having a circuit module positioned therein.

The circuit chamber 30 further includes a first plurality of bonding pads 32 and a second plurality of bonding pads 34 at opposing ends of the chamber. Generally, the bonding pads 32 are utilized to link the connector portion 24 to the circuit module 40. Likewise, the bonding pads 34 are utilized to connect the various components of the fluid sampling portion 28 to the circuit module 40.

As shown in the enlarged view of FIG. 2, the circuit module 40 is positioned within the circuit chamber 30 defined by the sensor housing 22. The circuit module 40 senses fluid, such as air flowing through a passage, by receiving signals from the fluid sampling portion 28. The circuit module 40 may be a single integrated circuit chip, or a substrate having discrete, as well as integrated circuits, mounted thereon. As shown in FIG. 2, the circuit module 40 is a circuit board having discrete electronic components 42 mounted thereon. The components 42 are in turn connected to other components, as well as to the bonding pads 32 and 34. As shown, one of the components 42 is attached to a ground pad 46 for connection to the grounding plane. As can be seen, each of these electric connections are accomplished by way of a wire bond which includes a wire 44 appropriately bonded, typically by welding, to the components 42, bonding pads 32, 34, and grounding pad 46. That is, the wires 44 are utilized to form wire bonds between the various electronic components 42, bonding pads 32, 34, and grounding pad 46.

As was previously described, the circuit chamber 30 is typically filled with a silicon gel layer 66 (FIG. 6) placed on top of the circuit module 40, including on top of the electronic components 42, and wire bonds formed with the wires 44 and bonding pads 32, 34 and grounding pad 46. The silicon gel layer 66 is typically two-five millimeters thick, and provides environmental protection (i.e., from water, dust or other debris) to the circuit module 40. Unfortunately, vibration of the vehicle, including the air intake passage, causes vibration in the sensor module 22, which in turn causes the silicon gel layer 66 to vibrate. This vibration in the silicon gel layer 66 can cause the wire bonds formed by wires 44 to prematurely break, and can also cause damage to the electronic components 42 of the circuit module 40. Accordingly, the present invention provides a slosh suppressor which inhibits the vibration in the silicon gel layer 66 and which also provides a path for conduction of heat away from the circuit module 40 providing for cooler electronics.

Figure 3:
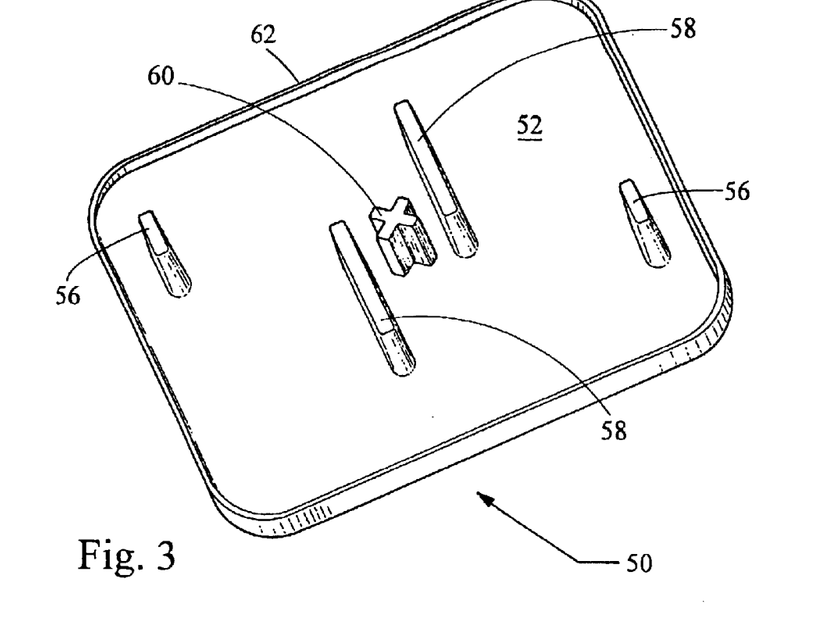
FIG. 3 is a perspective view, taken from the bottom, of a housing cover for use with the sensor module shown in FIG. 1.

Turning now to FIG. 3, a perspective view, taken from the bottom, is shown of a housing cover 50 which is utilized with the sensor module 22. The housing cover 50 is sized to be received within the circuit portion 26, and more particularly the circuit chamber 30 of the housing 22. The housing cover 50 includes a bottom surface 52 which has a tongue 62 projecting downwardly therefrom around the outer periphery of the cover 50. The circuit chamber 30 defines a ledge 46 for receiving the cover 50, and the ledge 46 includes a groove 48 for receiving the tongue 62 of the cover 50.

The cover 50 includes at least one, and preferably a plurality of projections extending downwardly from the bottom surface 52 for engaging the silicon gel layer. As shown in FIG. 3, the cover 50 includes projections 56 positioned adjacent opposing corners of the cover 50, as well as elongated projections 58 positioned adjacent the center of the cover 50, and a central projection 60 positioned at the center of the cover 50. The projections 56, 58, 60 can take virtually any shape or form, and are preferably arranged to be positioned adjacent the electronic components and wire bonds of the circuit module 40, but not directly above the same. As shown in FIG. 3, the projections 56, 58, 60 are symmetrically spaced so that the cover 50 can be placed on the housing 22 to cover the chamber 30 without worrying about orientation.

Figure 4:
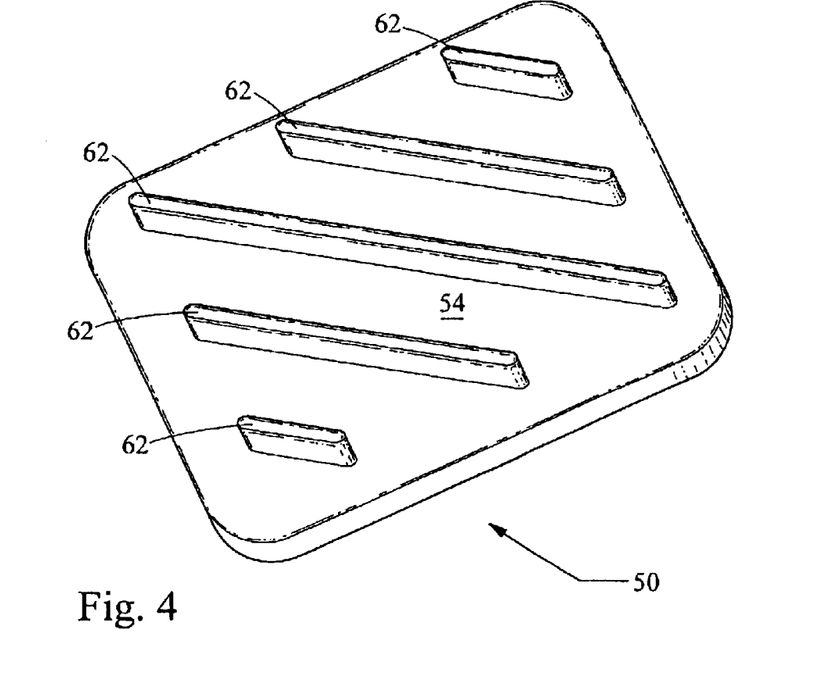
FIG. 4 is a perspective view, taken from the top, of a housing cover shown in FIG. 3.

A perspective view of the cover 50 is shown in FIG. 4, but taken from the top to show a top surface 54. A plurality of fins 62 of varying size are positioned on the top surface 54 of the cover 50. The fins 62 provide a structure for promoting heat transfer from the circuit module 40 through to the fluid passing by the sensor module 20.

Figure 5:
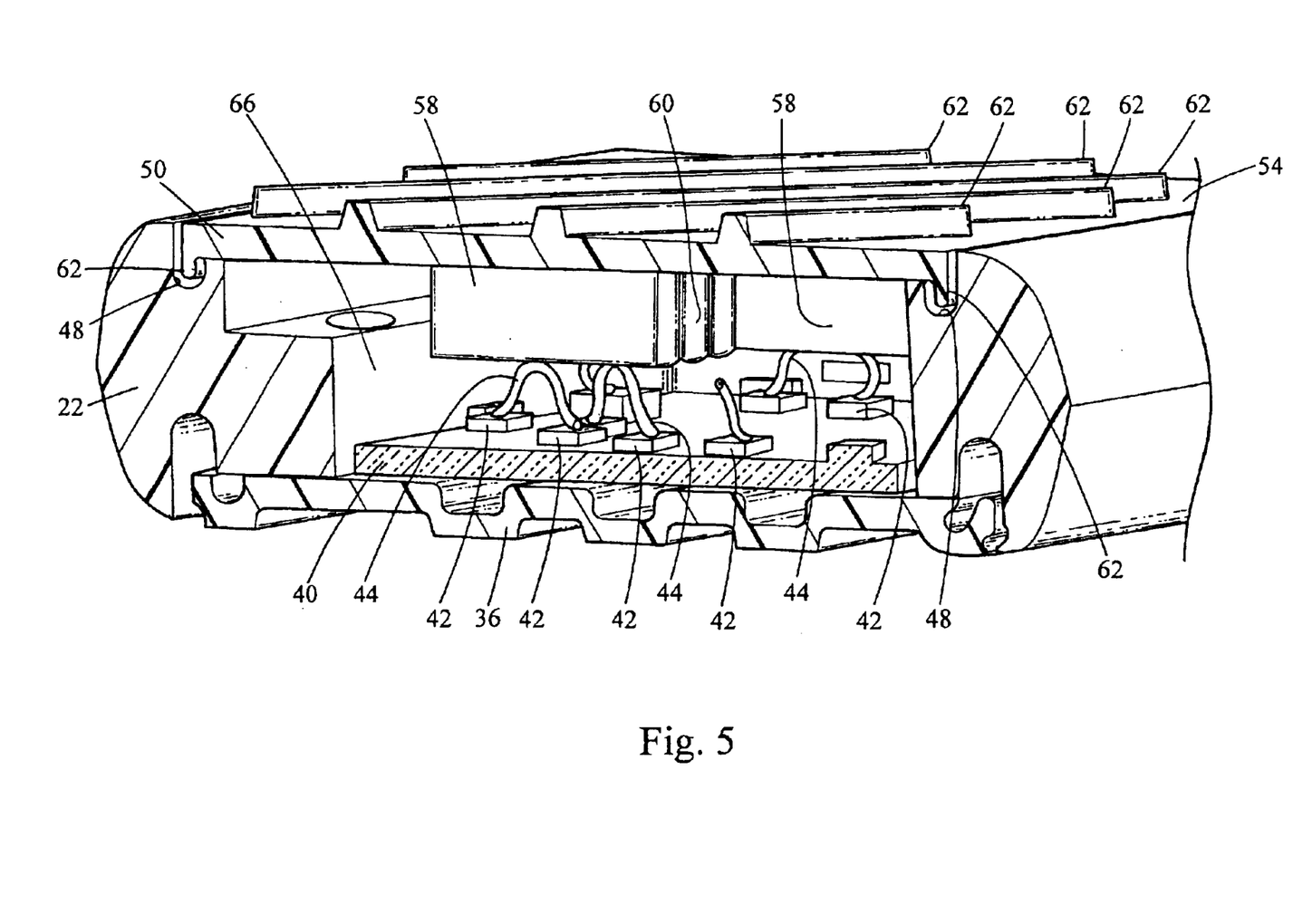
FIG. 5 is a cross sectional view of a sensor module and circuit module taken about the line 5—5 in FIG. 2.

As best seen in the cross-sectional view of FIG. 5, the cover 50 is attached to the housing 22 in a manner to close the circuit chamber 30. The cover 50 includes tongue 62 which fits in groove 48 formed in the ledge 46 of the housing. The bottom of the circuit chamber 30 is closed by the electronics cover 36 which is adhesively attached to a bottom surface of the housing 22. Preferably, the electronics cover 36 also includes a tongue for utilization with a groove formed in the housing 22. The electronics cover 36 positions a circuit module 40 within the circuit chamber 30. The circuit module 40 includes various electronic components 42 which are interconnected and connected to bonding pads 32, 34 by wires 44 to form the various wire bonds. As can be seen, the projections 58, 60 of the housing cover 50 project downwardly into the chamber 30.

Figure 6:
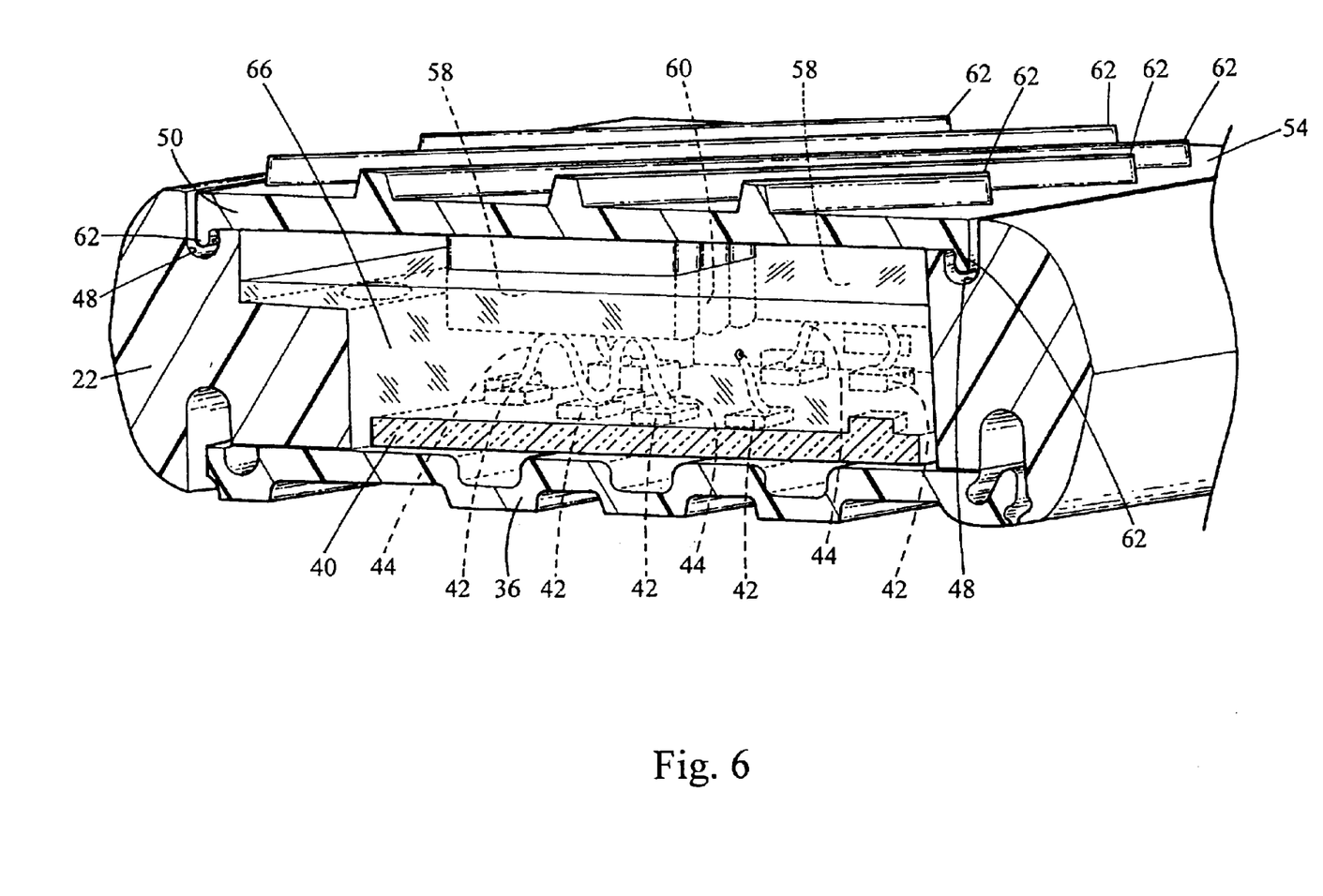
FIG. 6 is a cross-sectional view similar to FIG. 5, but showing the silicon gel layer positioned on the circuit module.

Turning now to FIG. 6, the same cross-sectional view of FIG. 5 has been shown, wherever a silicon gel layer 66 has been depicted. The silicon gel layer 66 is typically in liquid form and dispensed over the circuit module 40 to provide environmental protection to the same. The liquid silicon gel 66 is cured, typically by some heat, into a gelatinous matter of the final product. The projections 58, 60 extend downwardly and engage the silicon gel layer 66. As shown, the projections 58, 60 extend into the silicon gel layer to break up the same. That is, the projections divide the silicon gel layer 66 into different sections, whereby the projections 58, 60 inhibit the transfer of vibrational energy between the sections of the silicon gel layer 66. Preferably, the projections 58, 60 engage the silicon gel layer 66 to increase the resident frequency and reduce movement of the silicon gel layer when the sensor module 20 is subject to vibration. This occurs because the silicon gel layer 66 is divided into smaller mass sections which vibrate at a higher frequency, but a smaller distance. The projections 58, 60 are integrally formed with the cover 50, which are all constructed of a polymer, preferably a nylon hybrid polymer. The projections 58, 60 are preferably more rigid than the silicon gel layer 66.

Preferably, the plurality of projections 58, 60 do not intersect and thus do not create any chambers for trapping air. A layer of air extends between the silicon gel layer 66 and the bottom surface 52 of the cover 50. Trapped air can expand due to changes in temperature, which can cause problems with the sensor module 20. Similarly, air bubbles may be contained within the silicon gel layer 66 which need to escape. Accordingly, air circulation is promoted and the circuit chamber 30 is vented to the atmosphere. To accomplish the above, the projections are arranged to facilitate air circulation and do not provide any unvented or trapped areas of air.

Preferably, the projections 58, 60 are three to five millimeters in height and extend into the silicon gel layer as much as possible. Ideally, the projections are not positioned directly above the electronic components 421 or the wire bonds formed by wires 44, but rather are positioned adjacent to these structures so that the mass sections of the silicon gel layer 66 in those areas are very small to reduce the movement by increasing the resident frequency in those mass sections. The various projections on the cover 50 can be sized, arranged and coordinated to correspond to any particular circuit module 40 and its particular configuration. Preferably, the projections go into the silicon gel layer 66 as much as possible, typically about one to two millimeters. This is sufficient to break up the silicon gel layer 66 into different mass sections and inhibit the transfer of vibrational energy between the sections.

Figure 7:
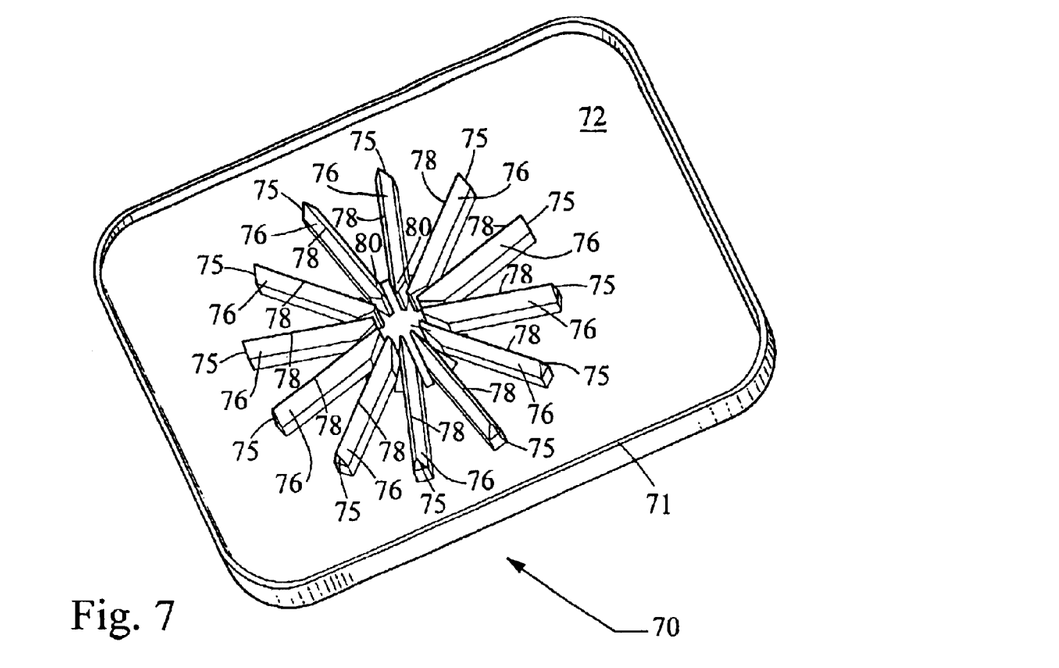
FIG. 7 is a perspective view, taken from the bottom, of an alternate embodiment of the housing cover.
Figure 8:
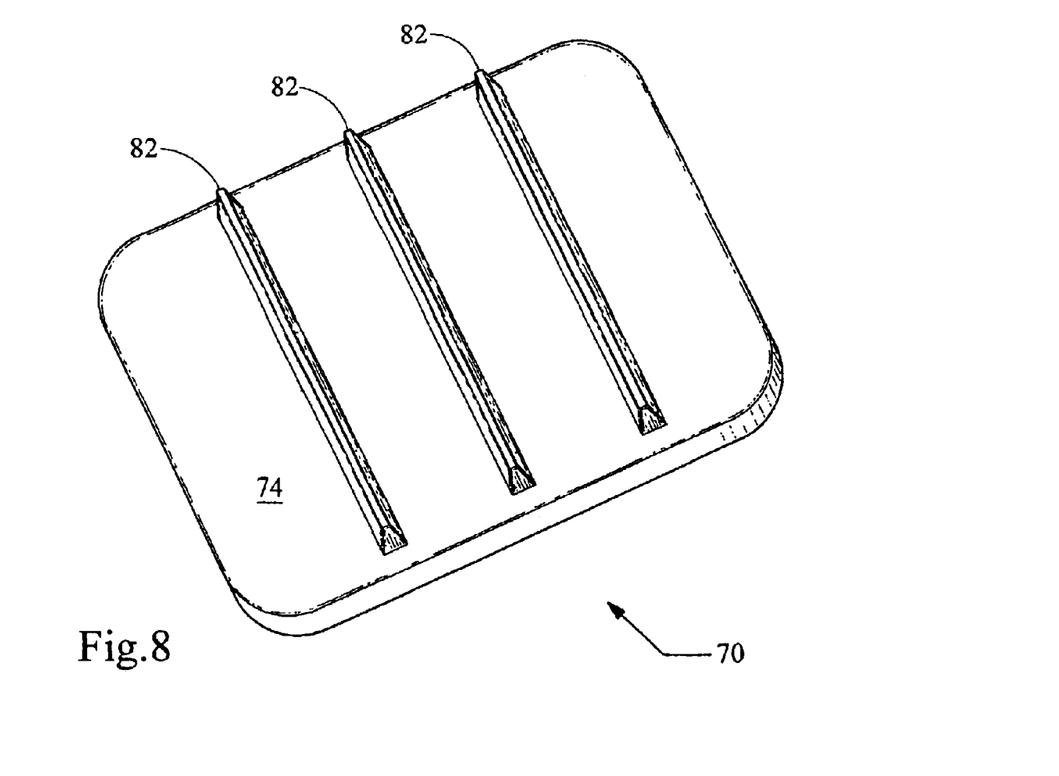
FIG. 8 is a perspective view, taken from the top, of the housing cover shown in FIG. 7.

Turning now to FIGS. 7 and 8, an alternate embodiment of the housing cover 70 has been depicted. In this embodiment, the housing cover 70 again includes a tongue 71 for engaging the groove 48 in the circuit chamber 30. The housing cover 70 includes a lower surface 72 having a plurality of projections 75 extending downwardly therefrom. The projections 75 are angularly spaced and extend radially from a center point to form a star shape. Each of the projections 75 includes an engagement surface 76 which is tapered. That is, the downward surfaces 76 of the projections 75 are tapered to define a edge 78. The engagement edge 78 is utilized to pierce the silicon gel layer 66 when the cover 70 is attached to the housing 22. It can also be seen that the inner end 80 of each projection 75 is tapered so that none of the inner ends 80 are in contact. As in the previous embodiment, that is to facilitate air circulation between the cover 70 and the silicon gel layer 66, and prevent any trapped air within the circuit chamber 30.

As shown in FIG. 8, the cover 70 includes an upper surface 74 having a plurality of fins 82 positioned thereon. The fins 82 are also tapered and are utilized to promote heat transfer through the cover 70. That is, heat from the circuit module 40 flows through the silicon gel layer 66 to the projections 75, which in turn flow through the body of the cover 70 and are convected through the fins 82 by way of the air or other fluids flowing through the passage in which the sensor module 20 is positioned. The projections 75 are positioned to fit within an open area in the chamber which is not directly above the electronic components 42 or wire bonds formed by the wires 44 and bonding pads 32, 34, 46. Nonetheless, the projections 75 break up the silicon gel layer 66 in the areas adjacent the wire bonds and electronic components 42 in order to decrease the mass sections in those areas and provide less vibrational movement by virtue of increased resident frequency.

Therefore, it can be seen that the slosh suppressor of the present invention protects the electronic components 42 and wire bonds formed by the wires 44 by breaking up the silicon gel layer 66 into smaller mass regions and thus reducing its inertial effects on the same. Furthermore, the projections extending into the silicon gel layer provide a conduction path for heat transfer which can then be convected through the housing cover, and preferably utilizing fins on the cover's outer surface. The air or other fluid flow around the outer surface of the sensor module 20 allows convection of the heat from the cooling fins on the outer surface of the cover.

The foregoing description of various embodiments of the invention has been presented for purposes of illustration and description. It is not intended to be exhaustive or to limit the invention to the precise embodiments disclosed. Numerous modifications or variations are possible in light of the above teachings. The embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A module comprising:

a housing defining a circuit chamber;

a circuit module positioned within the circuit chamber;

a silicon gel layer positioned on the circuit module for protecting the circuit module from the environment; and a housing cover structured to engage the housing and close the circuit chamber, the housing cover having a projection extending into the circuit chamber and engaging the silicon gel layer to reduce vibrational displacement in the silicon gel layer.

2. The module of claim 1, wherein the projection extends into the silicon gel layer.

3. The module of claim 2, wherein the projection extends only partially into the silicon get layer.

4. The module of claim 2, wherein the projection extends through a majority of the silicon gel layer.

5. The module of claim 1, wherein the projection divides the silicon gel layer into multiple sections, the projection inhibiting the transfer of vibrational energy between sections of the silicon gel layer.

6. The module of claim 1, wherein the projection engages the silicon gel layer to increase the resonant frequency of the silicon gel layer when the sensor module is subject to vibration.

7. The module of claim 1, wherein the projection is more rigid than the silicon gel layer.

8. The module of claim 1, wherein the projection extends away from the housing cover and defines an engagement surface.

9. The module of claim 8, wherein the engagement surface is tapered.

10. The module of claim 8, wherein the engagement surface defines an engagement edge for piercing the silicon gel layer.

11. The module of claim 1, wherein the housing cover includes a plurality of projections extending into the circuit chamber.

12. The module of claim 11, wherein the plurality of projections do not intersect.

13. The module of claim 11, wherein the plurality of projections are arranged to prevent trapped air within the circuit chamber between the silicon gel layer and the housing cover.

14. The module of claim 1, wherein the circuit module includes a wire bond covered by the silicon gel layer, and wherein the projection is positioned adjacent the wire bond.

15. The module of claim 1, wherein the projection engages the silicon gel layer to form a conductive heat path from the circuit module to an outer surface of the cover for cooling the circuit module.

16. The module of claim 1, wherein the housing cover includes opposing inner and outer surfaces, the inner surface having the projection, the outer surface having a plurality of fins for promoting heat transfer.

17. A mass air flow sensor for insertion into a passage to measure the air intake of an automobile engine, the sensor comprising:

a sensor housing defining a circuit chamber;

a circuit module positioned within the circuit chamber, the circuit module including a wire bond;

a silicon gel layer positioned on the circuit module for protecting the circuit module and the wire bond from the environment; and a housing cover structured to engage the sensor housing and close the circuit chamber, the housing cover having a projection extending into the circuit chamber and into the silicon gel layer to reduce vibrational displacement in the silicon gel layer.

18. The sensor of claim 17, wherein the projection extends only partially into the silicon get layer.

19. The sensor of claim 17, wherein the projection is positioned adjacent the wire bond.

20. The sensor of claim 17, wherein the projection engages the silicon gel layer to increase the resonant frequency of the silicon gel layer when the sensor module is subject to vibration.

21. The sensor of claim 17, wherein the housing cover includes a plurality of projections extending into the circuit chamber.

22. The sensor of claim 21, wherein the plurality of projections are arranged to prevent trapped air within the circuit chamber between the silicon gel layer and the housing cover.

23. The sensor module of claim 17, wherein the projection engages the silicon gel layer to form a conductive heat path from the circuit module to an outer surface of the cover for cooling the circuit module.

* * * * *